United States Patent
Kim

(10) Patent No.: US 7,300,834 B2
(45) Date of Patent: Nov. 27, 2007

(54) METHODS OF FORMING WELLS IN SEMICONDUCTOR DEVICES

(75) Inventor: Dae Kyeun Kim, Yongin (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/025,121

(22) Filed: Dec. 28, 2004

(65) Prior Publication Data

US 2005/0142728 A1 Jun. 30, 2005

(30) Foreign Application Priority Data

Dec. 30, 2003 (KR) .................. 10-2003-0100550

(51) Int. Cl.
*H01L 21/8238* (2006.01)
(52) U.S. Cl. .................. 438/199; 438/223; 438/449
(58) Field of Classification Search ........ 438/199–234, 438/433–434, 447–451
See application file for complete search history.

(56) References Cited

U.S. PATENT DOCUMENTS

| 5,071,777 | A | * | 12/1991 | Gahle ..................... 438/443 |
| 5,206,535 | A | * | 4/1993 | Namose ................... 257/519 |
| 5,679,588 | A | * | 10/1997 | Choi et al. ............... 438/401 |
| 5,937,286 | A | * | 8/1999 | Abiko ...................... 438/218 |
| 6,228,726 | B1 | * | 5/2001 | Liaw ........................ 438/294 |

\* cited by examiner

*Primary Examiner*—H. Jey Tsai
(74) *Attorney, Agent, or Firm*—Andrew D. Fortney

(57) ABSTRACT

Disclosed herein are methods of forming a well in a semiconductor device, in which a well end point under a trench is formed deeper than other area by well implantation prior to trench filling and by which leakage current is minimized. In one example, the disclosed method includes forming a trench in a surface of a substrate to define a field area, forming a first conductive type well in a first active area of the substrate, forming a second conductive type well in a second active area of the substrate, and filling up the trench with a dielectric.

20 Claims, 16 Drawing Sheets

METHODS OF FORMING WELLS IN SEMICONDUCTOR DEVICES

TECHNICAL FIELD

The present disclosure relates to semiconductor devices and, more particularly, to methods of forming wells in semiconductor devices.

BACKGROUND

Generally, in semiconductor device fabrication, well implantation is carried out after completion of shallow trench isolation (STI), STI filling, and STI planarization. FIGS. 1A to 1F are cross-sectional diagrams for explaining a known method of forming a well in a semiconductor device. Referring to FIG. 1A, a pad oxide layer 11 is grown on a silicon substrate 10 by thermal oxidation. A pad nitride (SiN) layer 12 and a pad tetraethylortho silicate (TEOS) layer 13 are sequentially deposited on the pad oxide layer 11.

Photoresist is coated on the pad TEOS layer 13. Exposing and developing are carried out on the photoresist layer to form a photoresist pattern 14 exposing a prescribed surface of the pad TEOS layer 13 corresponding to an STI area for semiconductor device isolation. The pad TEOS, nitride, and oxide layers 13, 12, and 11 are etched to expose a portion of the semiconductor substrate 10 using the photoresist pattern 14 as an etch mask. The exposed portion of the semiconductor substrate 10 is etched to form a trench 15.

Referring to FIG. 1B, after the photoresist pattern has been removed, an additional etch is carried out for STI rounding and divot depth adjustment. Further, referring to FIG. 1C, an oxide layer 16 is formed on an inside of the trench 15. Referring to FIG. 1D, a dielectric layer 17 is formed on the pad TEOS layer 13 to fill up the trench 15.

Referring to FIG. 1E, planarization including chemical mechanical polishing (CMP) is carried out on the dielectric layer 17 until the pad nitride layer 12 is exposed. As shown in FIG. 1F, the pad nitride layer is removed to expose the pad oxide layer 11 so that the dielectric layer 17 remains to fill up the trench only. Hence, an STI layer 17 is completed.

Referring to FIG. 1G, a photoresist pattern 18-1 exposing an n-well area is formed over the substrate 10. An n-well ion implantation is carried out on the substrate to form an n-well 19-1 in an active area of the substrate 10.

Referring to FIG. 1H, a photoresist pattern 18-2 exposing a p-well area is formed over the substrate 10. A p-well ion implantation is carried out on the substrate to form a p-well 19-2 in another active area of the substrate 10. Hence, final profiles of the n-well 19-1 and p-well 19-2 are completed.

However, according to the known method, a profile for a peak point of a dopant implanted by the well ion implantation is changed as shown in FIG. 1I. Namely, the dopant penetrating the STI layer 17 is unable to form a deep dopant profile. Additionally, the well peak point failing to be formed deep under the STI layer works as a leakage point to increase the current leakage between the bulk and junction, whereby semiconductor device performance is degraded.

DETAILED DESCRIPTION

Disclosed herein are methods forming wells in a semiconductor device, in which a well end point under a trench is formed deeper than another area by well implantation prior to trench filling, thereby minimizing leakage current.

Figure 1A:
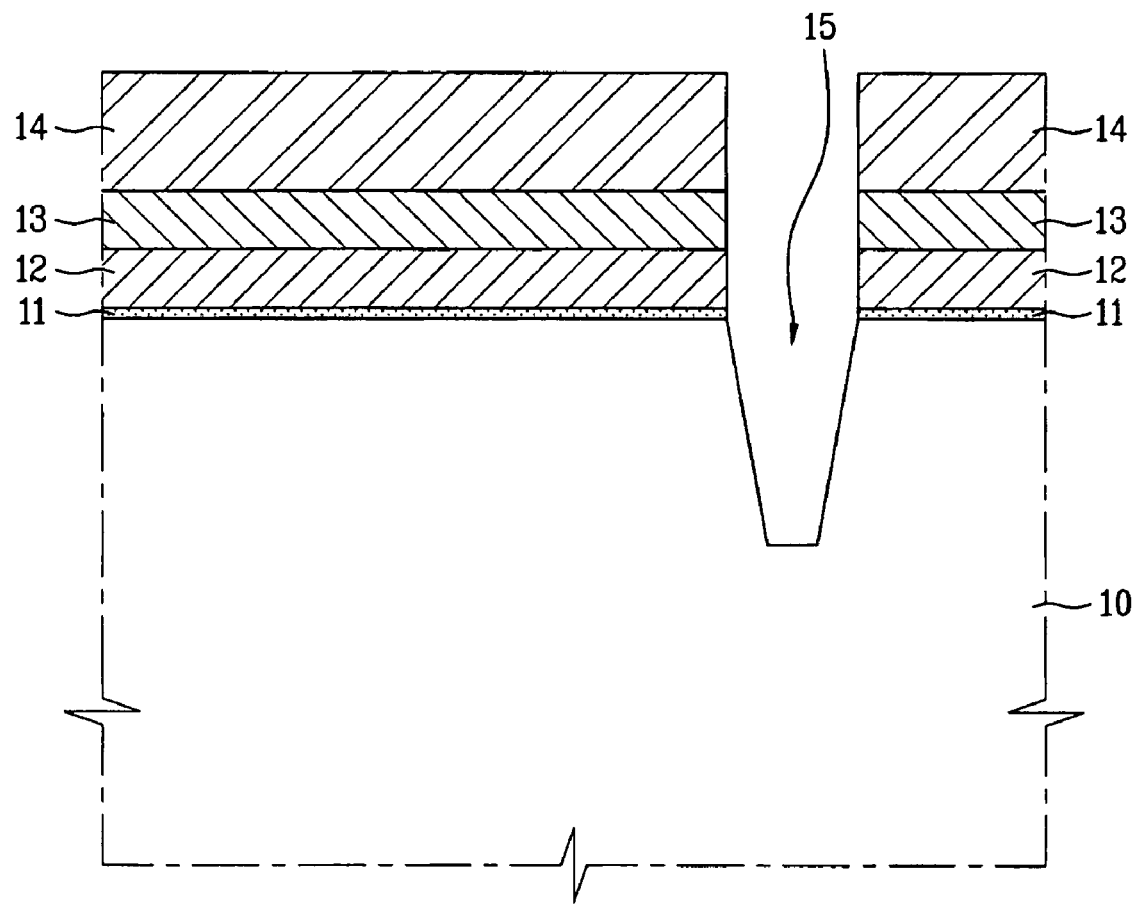
FIGS. 1A to 1I are cross-sectional diagrams for explaining a known method of forming a well in a semiconductor device.
Figure 1B:
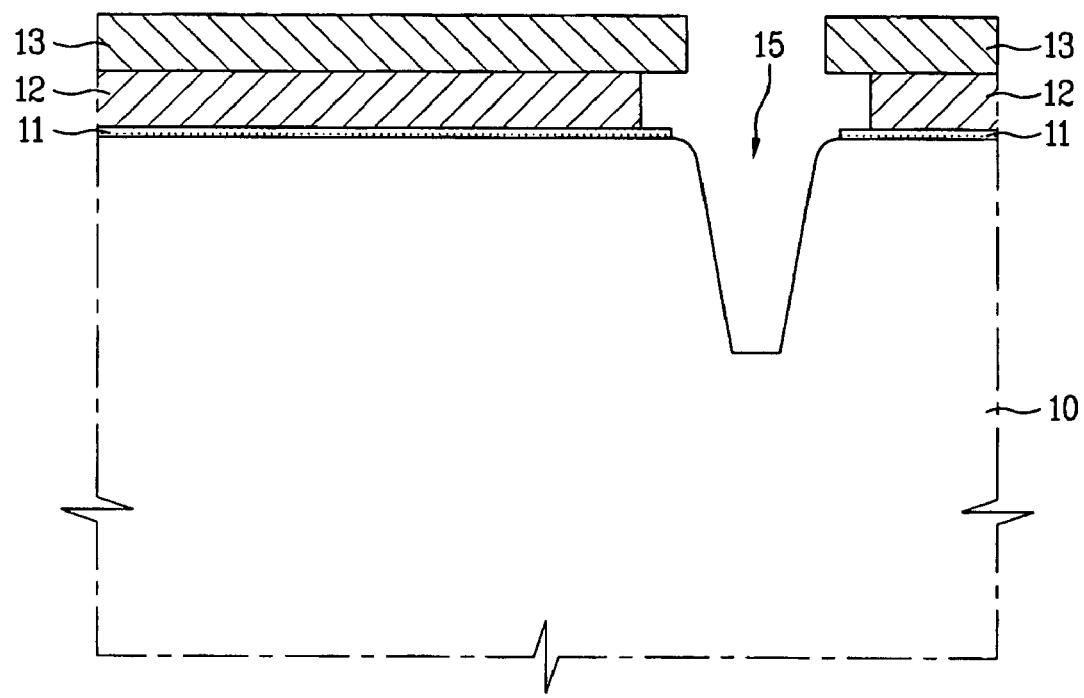
Figure 1C:
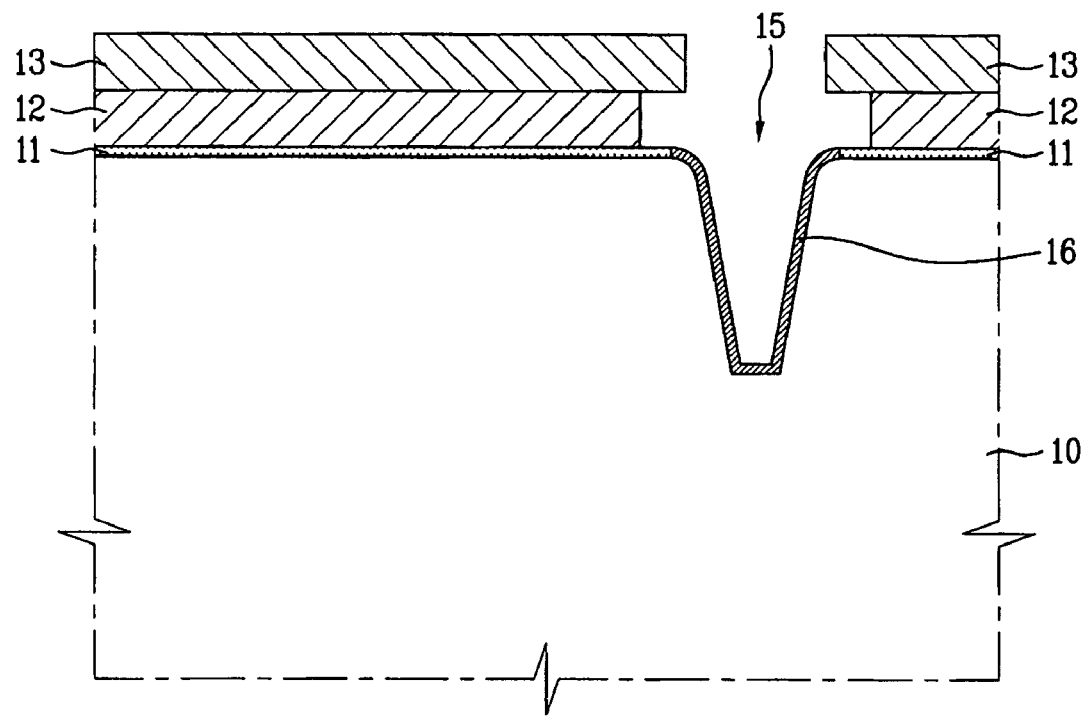
Figure 1D:
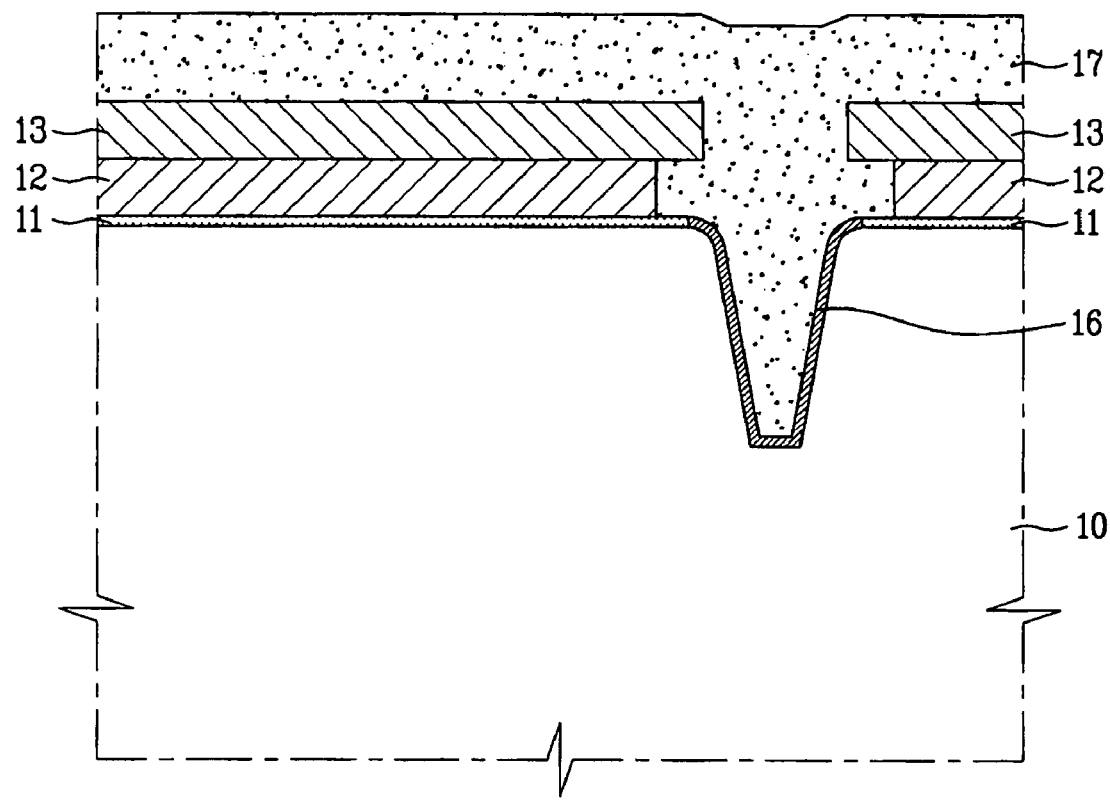
Figure 1E:
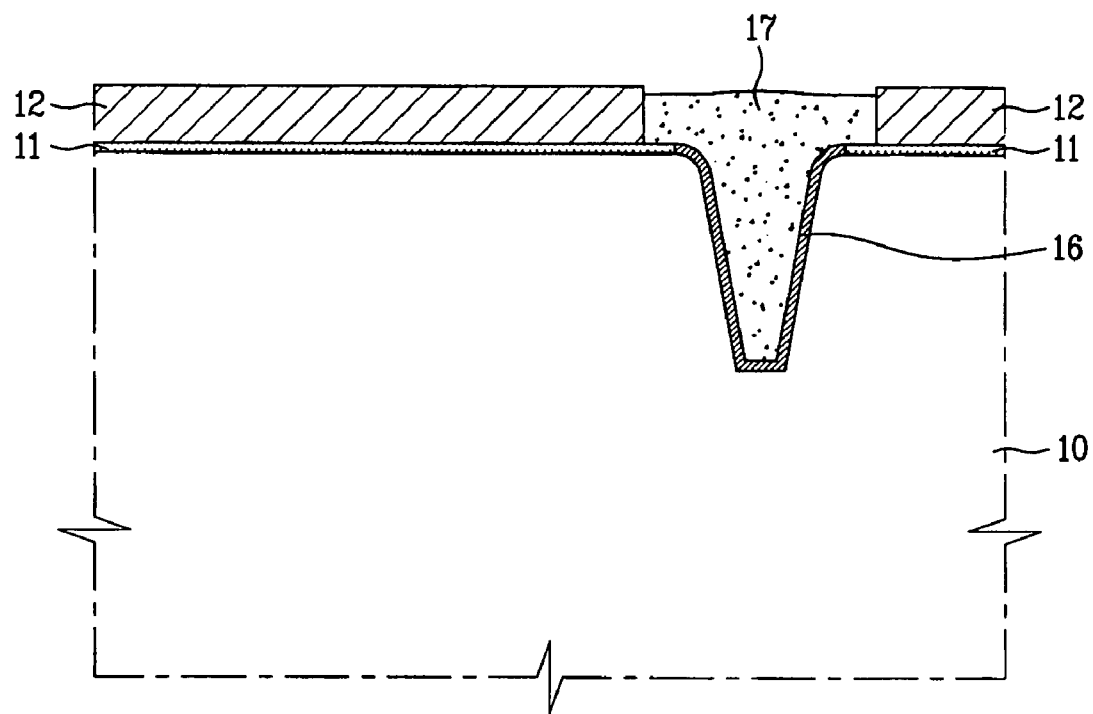
Figure 1F:
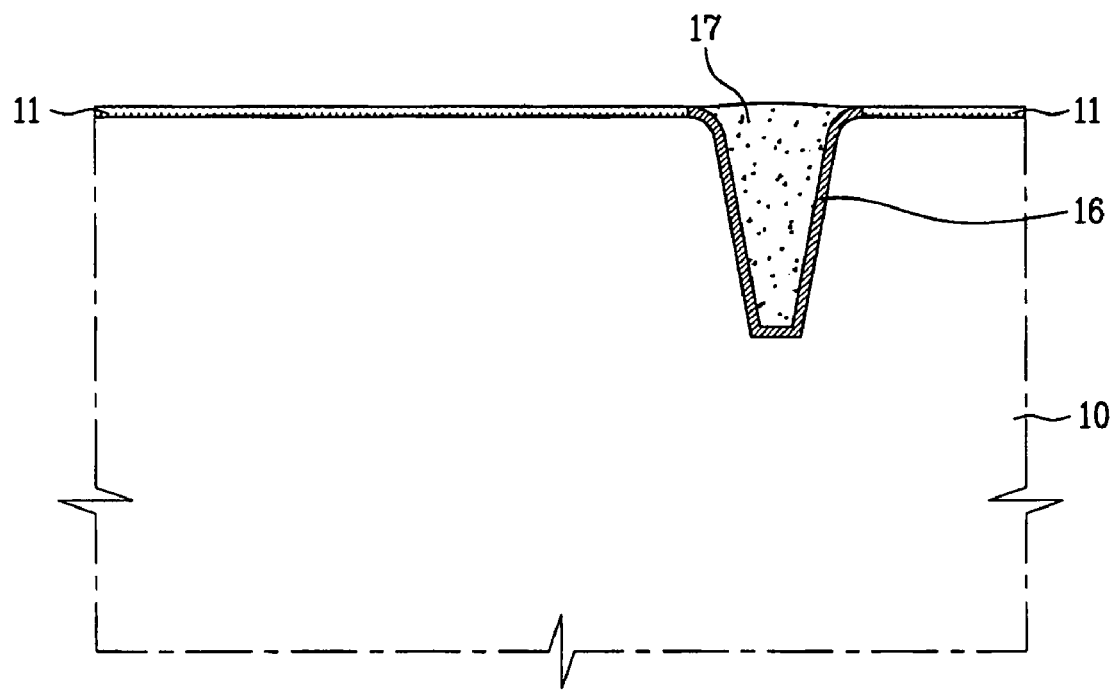
Figure 1G:
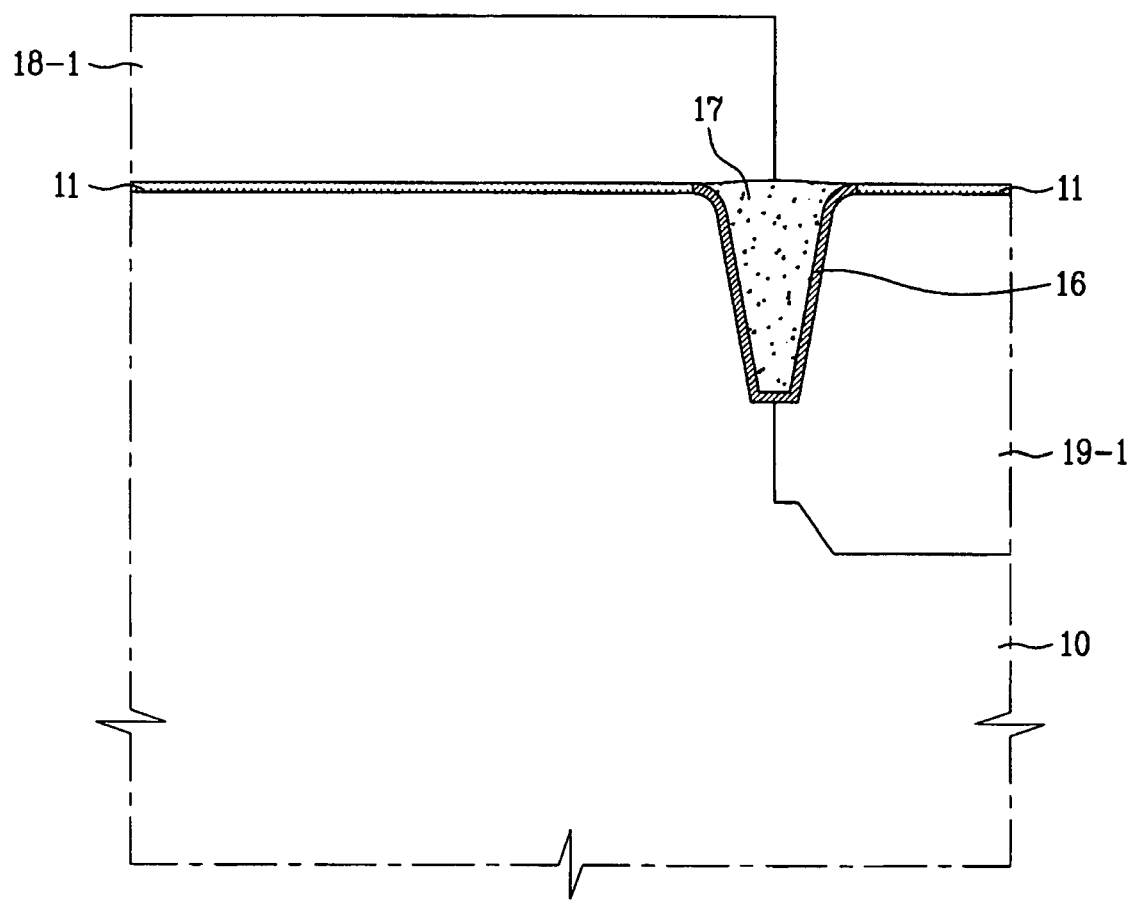
Figure 1H:
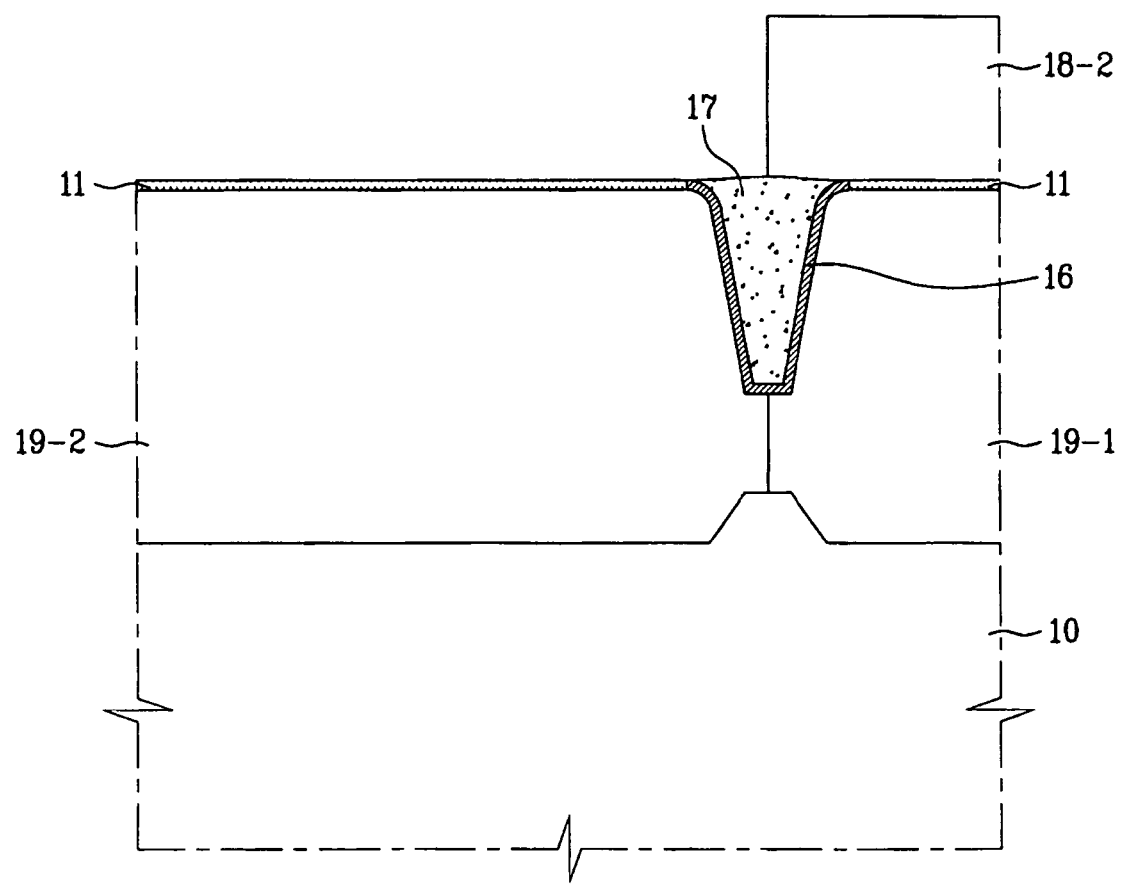
Figure 1I:
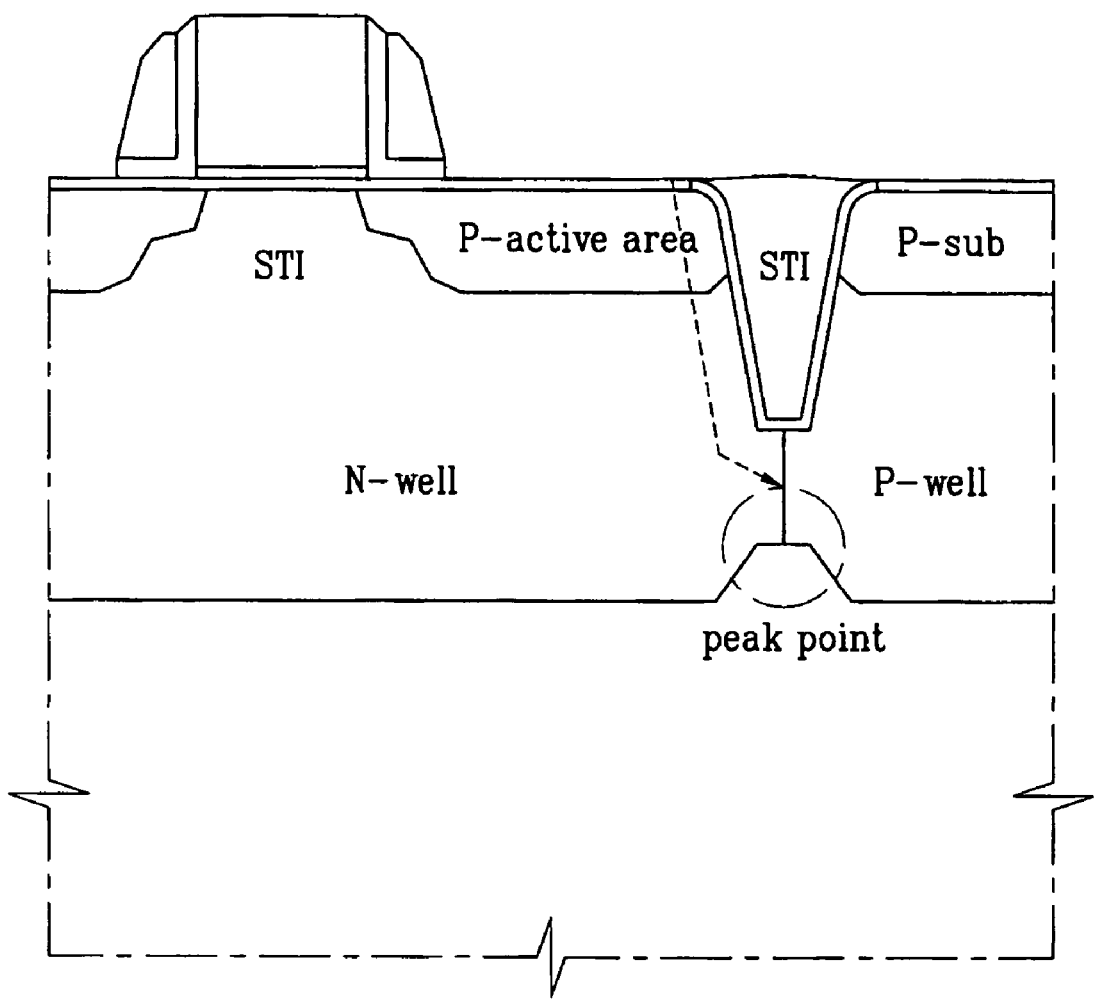
Figure 2A:
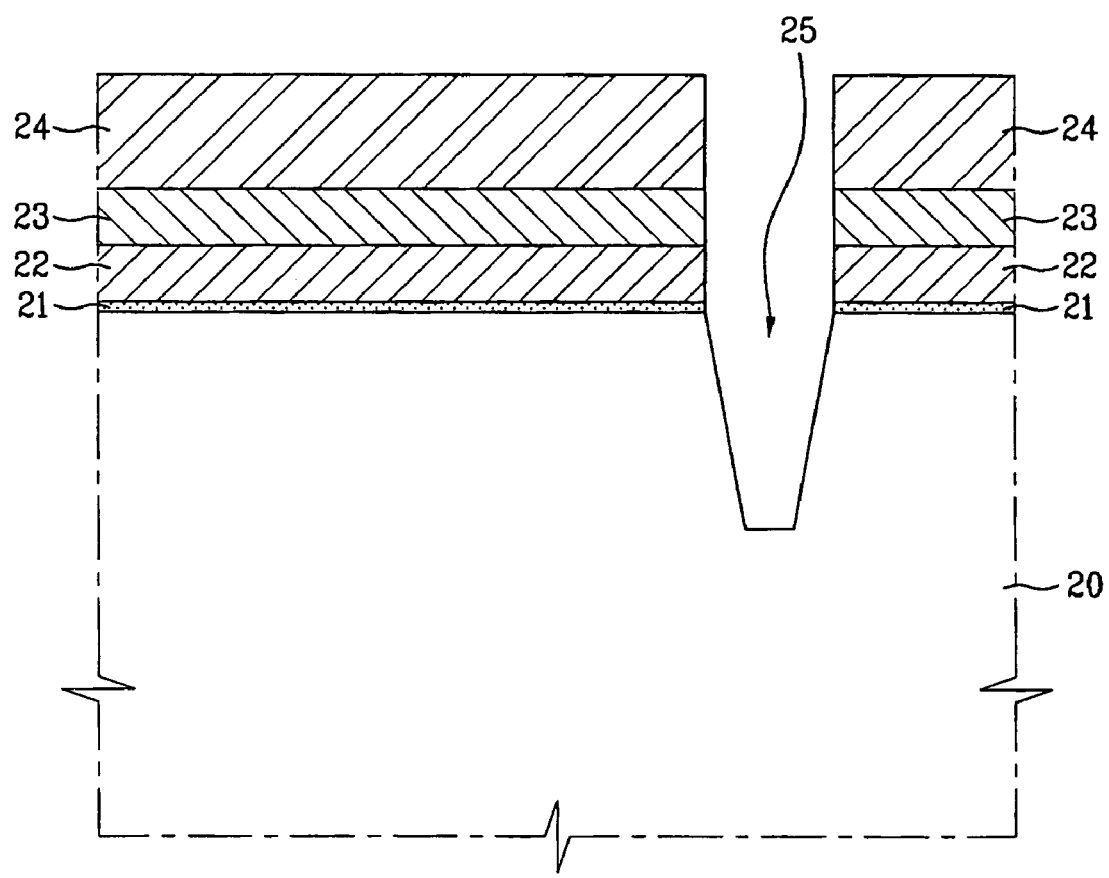
FIGS. 2A to 2G are cross-sectional diagrams of semiconductor structures for explaining the disclosed methods of forming a well in a semiconductor device.

Referring to FIG. 2A, a pad oxide layer 21 is grown on a silicon substrate 20 by thermal oxidation. A pad nitride (SiN) layer 22 and a pad TEOS layer 23 are sequentially deposited on the pad oxide layer 21. Photoresist is coated on the pad TEOS layer 23. Exposing and developing are carried out on the photoresist layer to form a photoresist pattern 24 exposing a prescribed surface of the pad TEOS layer 23 corresponding to an STI area for semiconductor device isolation.

The pad TEOS, nitride, and oxide layers 23, 22, and 21 are etched to expose a portion of the semiconductor substrate 20 using the photoresist pattern 24 as an etch mask. The exposed portion of the semiconductor substrate 20 is etched to form a trench 25.

Figure 2B:
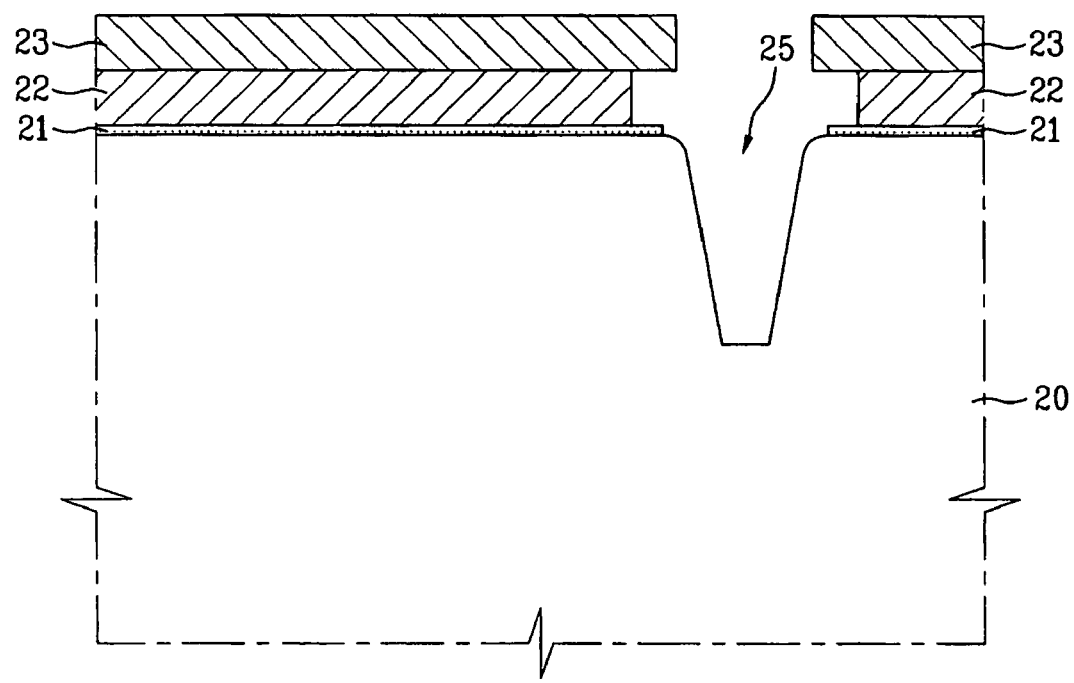

Referring to FIG. 2B, after the photoresist pattern has been removed, an additional etch is carried out for STI rounding and divot depth adjustment.

Figure 2C:
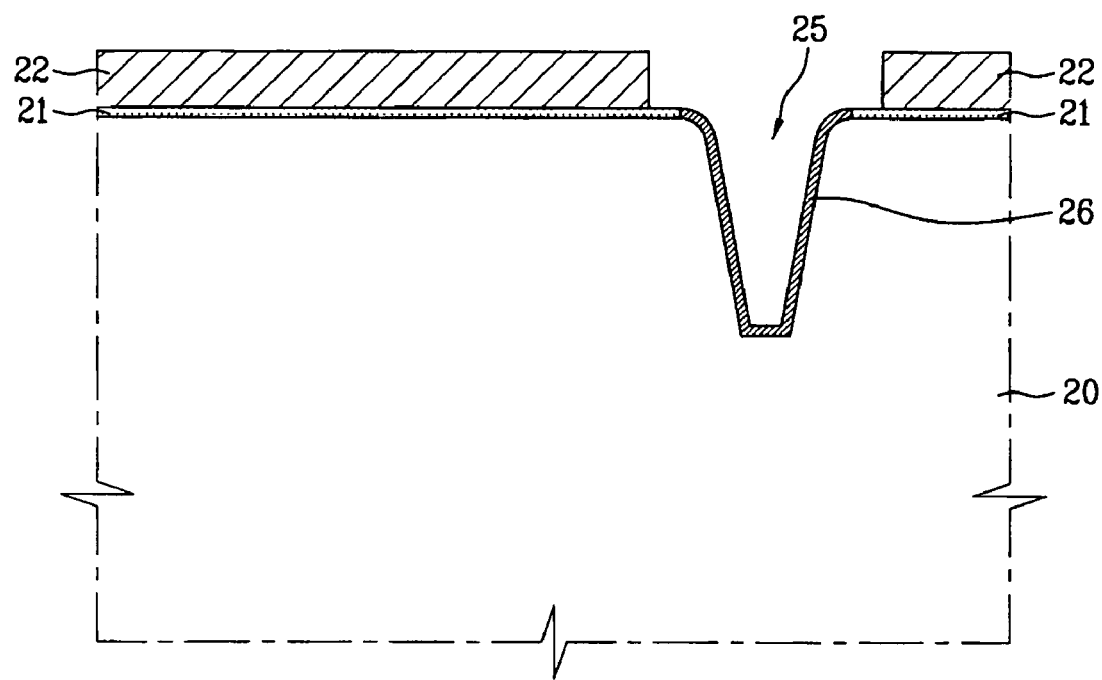
Figure 2D:
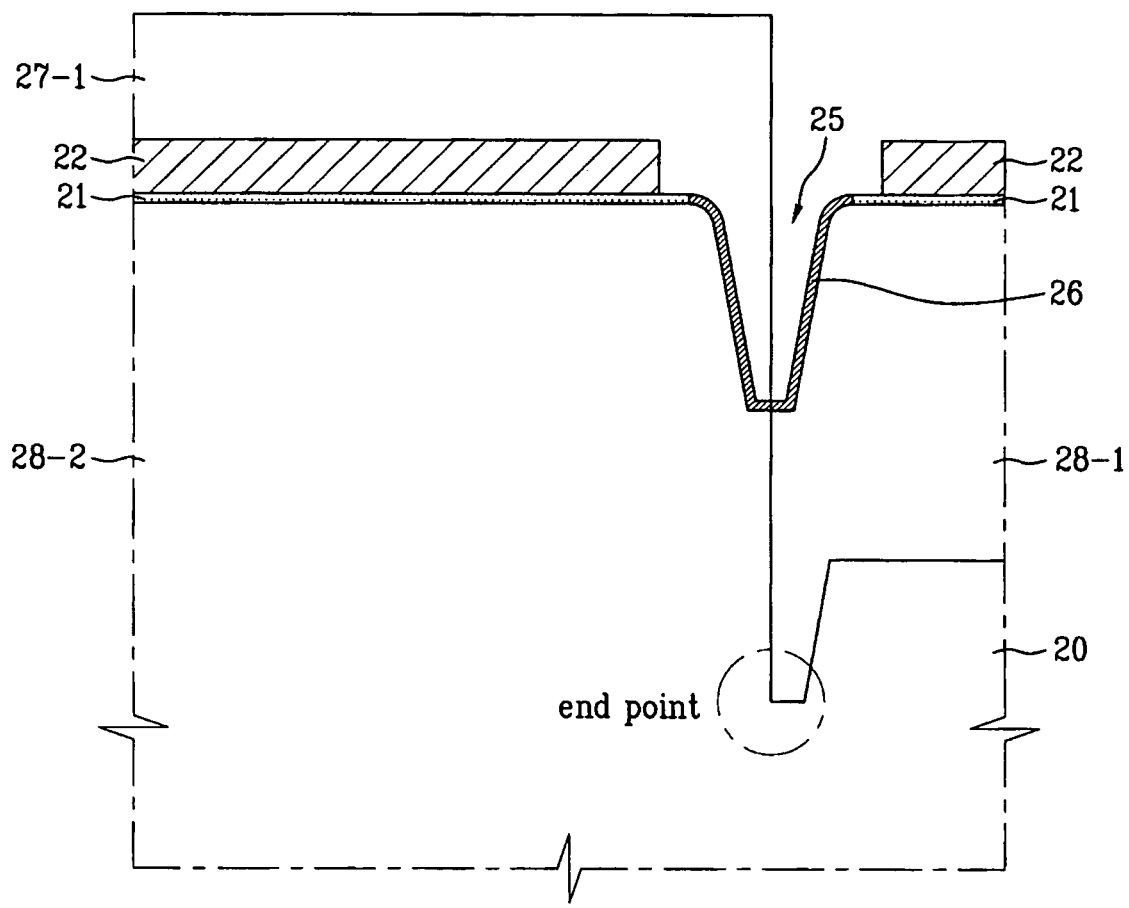

As shown in FIGS. 2C and 2D, an oxide layer 26 is formed on an inside of the trench 25 and a photoresist pattern 27-1 exposing an n-well area and a half of the trench 25 is formed over the substrate 20. An n-well ion implantation is carried out on the substrate to form an n-well 28-1 in an active area of the substrate 20.

Figure 2E:
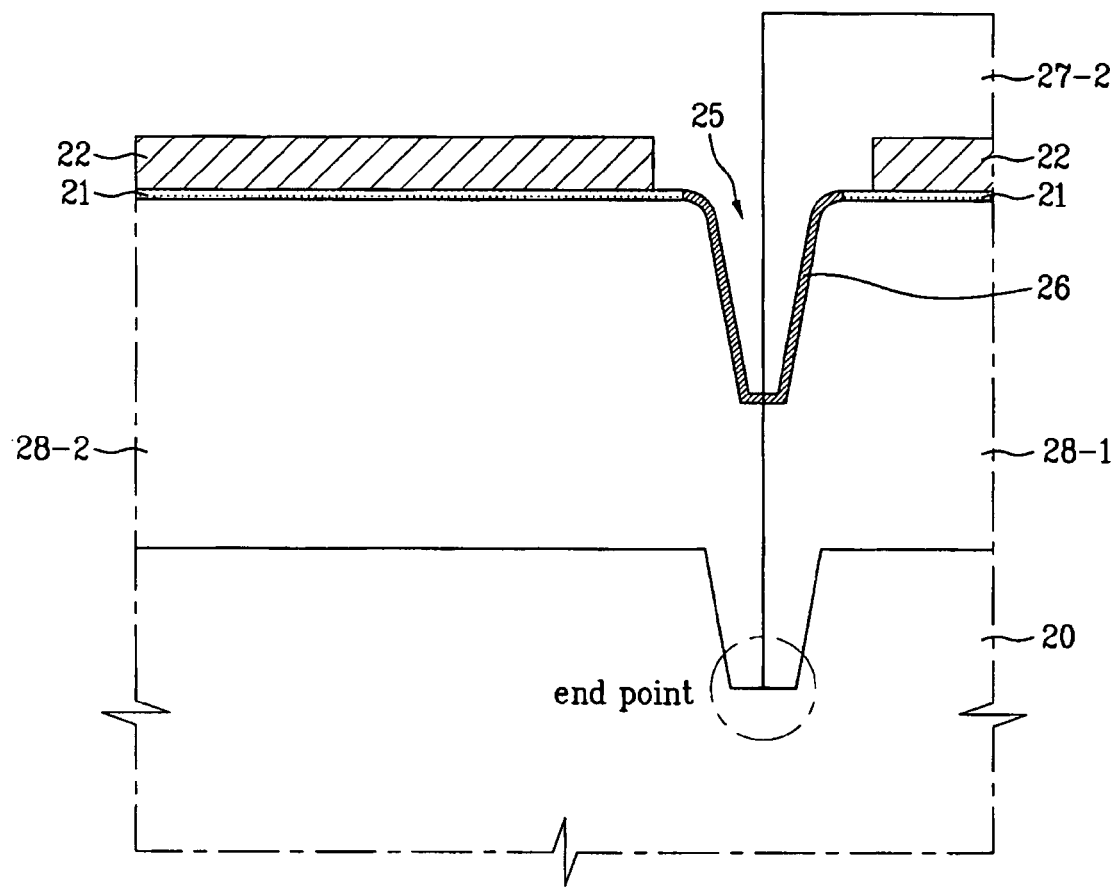

Referring to FIG. 2E, a photoresist pattern 27-2 exposing a p-well area and the other half of the trench 25 is formed over the substrate 20. A p-well ion implantation is carried out on the substrate to form a p-well 28-2 in another active area of the substrate 20. Hence, final profiles of the n-well 28-1 and p-well 28-2 are completed. In doing so, a well end point formed under the trench is formed deeper than that of the related art to elongate a leakage path, whereby leakage current between a junction and a bulk of the silicon substrate 20 is minimized.

Figure 2F:
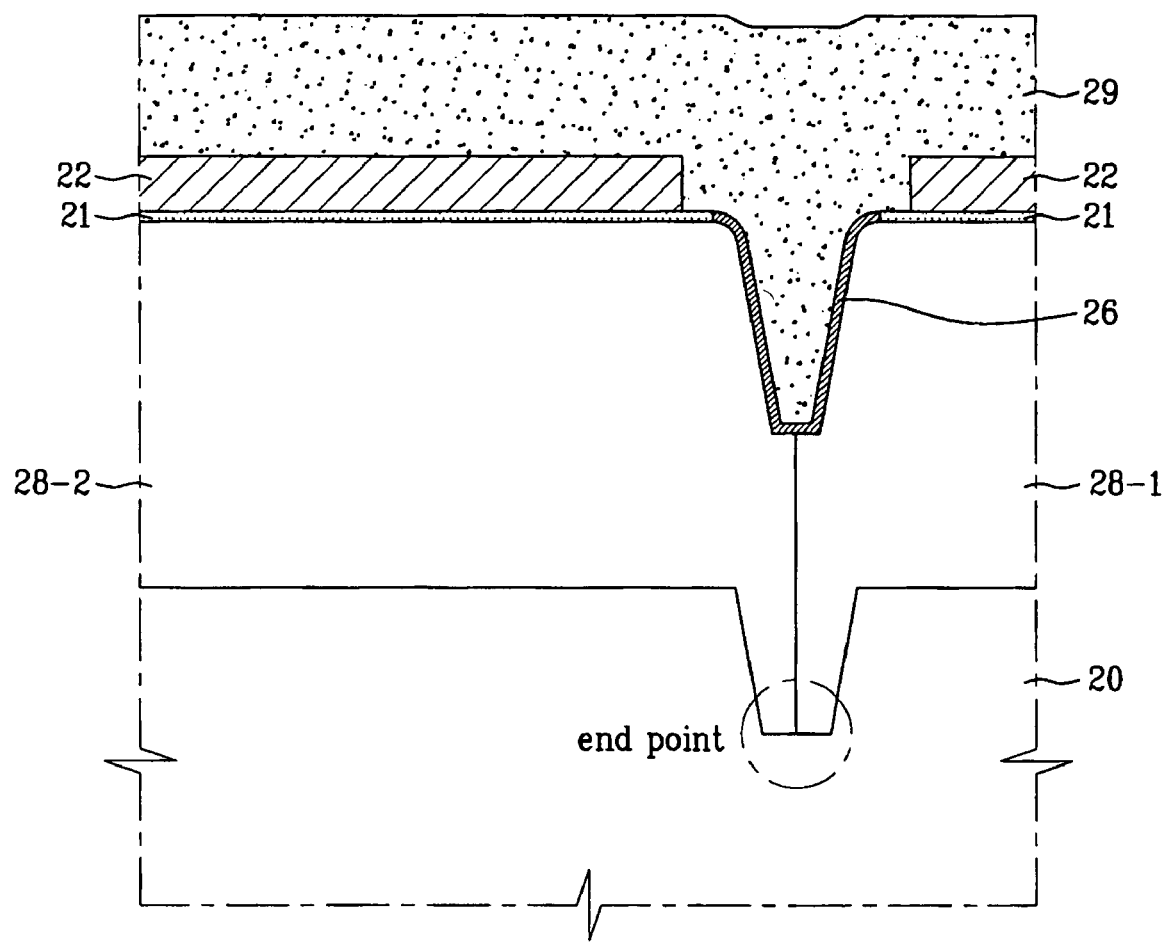
Figure 2G:
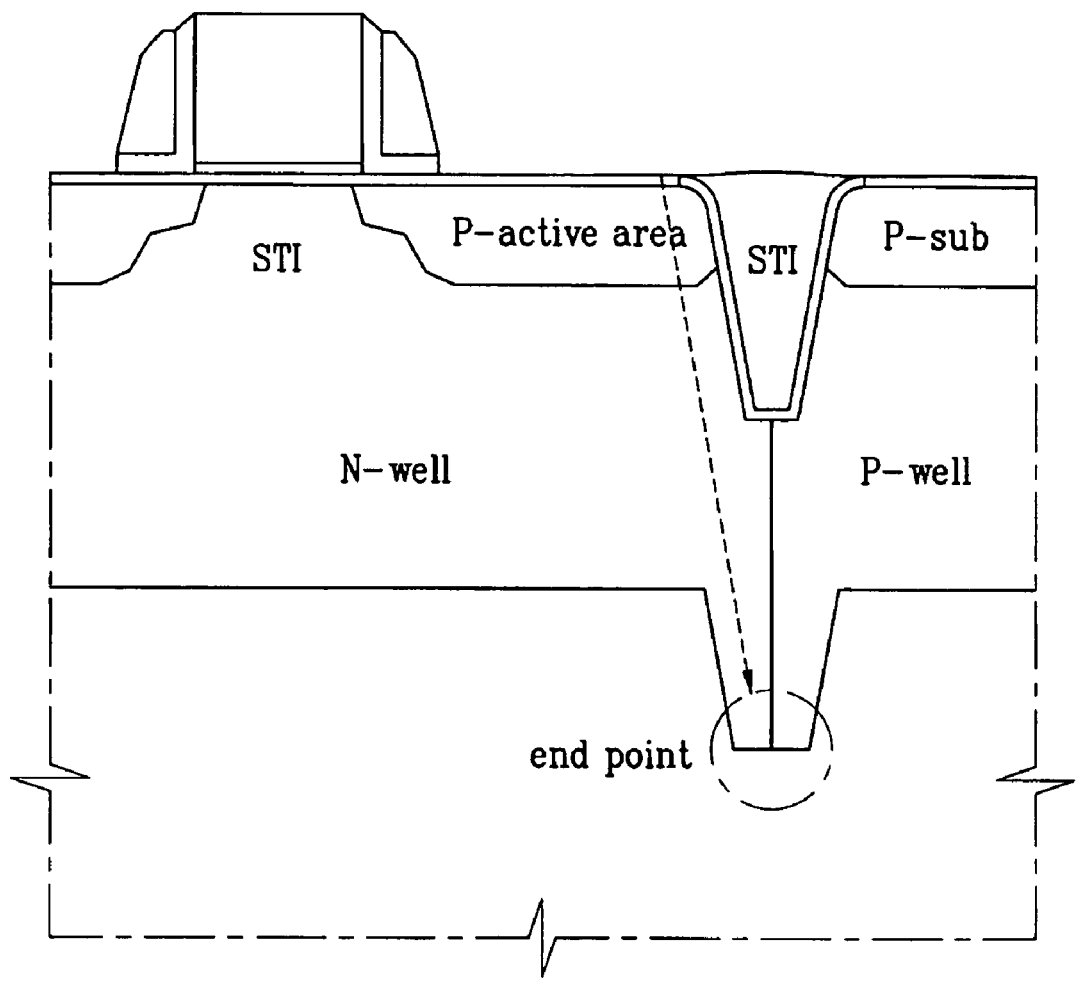

Referring to FIG. 2F, a dielectric layer 29 is formed on the pad nitride layer 22 to fill up the trench. Planarization including CMP is carried out on the dielectric layer 29. As shown in FIG. 2G, the pad nitride layer is removed to expose the pad oxide layer 11 so that the dielectric layer 29 remains to fill up the trench only. Hence, an STI layer is completed and a prescribed transistor is formed on the corresponding active area.

As disclosed herein, a well end point under a trench is formed deeper than other area by well implantation prior to trench filling, a well end point under a trench is formed deep, and an active area is protected by a thin nitride layer. Therefore, a leakage path is formed longer under the trench to reduce a damage of the active area and leakage current is minimized.

Further, as disclosed herein, well ion implantation is carried out prior to filling a trench with a dielectric and amendment of equipments or processes is minimized to be directly applicable to production, whereby leakage current is minimized without additional investment.

According to one example, a disclosed method forming a well in a semiconductor substrate may include forming a trench in a surface of a substrate to define a field area, forming a first conductive type well in a first active area of the substrate, forming a second conductive type well in a second active area of the substrate, and filling up the trench with a dielectric.

In one example, the first and second active areas are isolated from each other by the field area. The first conductive type well forming may include forming a first ion implantation mask on the substrate to expose the first active area and a first half of the trench in the vicinity of the first active area, implanting a first conductive type dopant into the substrate exposed by the first ion implantation mask, and removing the first ion implantation mask.

The first ion implantation mask may be formed of a first photoresist pattern. The second conductive type well forming may includes forming a second ion implantation mask on the substrate to expose the second active area and a second half of the trench in the vicinity of the second active area, implanting a second conductive type dopant into the substrate exposed by the second ion implantation mask, and removing the second ion implantation mask.

Further, the second ion implantation mask may be formed of a first photoresist pattern. In one example, well end points of the first and second conductive type wells may be formed under the trench to be deeper than bottoms of the first and second conductive type wells in the corresponding active areas, respectively.

This application claims the benefit of the Korean Application No. P2003-0100550 filed on Dec. 30, 2003, which is hereby incorporated by reference.

Although certain apparatus constructed in accordance with the teachings of the invention have been described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method of forming a well in a semiconductor substrate comprising:
    forming an STI trench in a surface of a substrate to define a field area;
    forming a first ion implantation mask over the substrate and the trench such that a first active area and a first part of the trench are exposed;
    forming a first conductive type well in the first active area of the substrate and under the first part of the trench so that an end point of the first conductive type well under the first part of the trench is deeper than a bottom of the first conductive type well in the first active area;
    forming a second ion implantation mask over the first active area and the first part of the trench;
    forming a second conductive type well in a second active area of the substrate and under a second part of the trench so that an end point of the second conductive type well under the second part of the trench is deeper than a bottom of the second conductive type well in the second active area, wherein the first and second conductive type wells meet under the trench and the end points of the first and second conductive type wells where the first and second conductive type wells meet are deeper than bottoms of the first and second conductive type wells in the first and second active areas; and
    filling the trench with a dielectric after forming the first and second conductive type wells.

2. A method as defined by claim 1, wherein the first and second active areas are isolated from each other by the field area.

3. A method as defined by claim 1, wherein forming the first conductive type well comprises:
    implanting a first conductive type dopant into the substrate exposed by the first ion implantation mask; and
    removing the first ion implantation mask.

4. A method as defined by claim 3, wherein the first ion implantation mask comprises a first photoresist pattern.

5. A method as defined by claim 1, wherein forming the second conductive type well comprises:
    implanting a second conductive type dopant into the substrate exposed by the second ion implantation mask; and
    removing the second ion implantation mask.

6. A method as defined by claim 5, wherein the second ion implantation mask comprises a first photoresist pattern.

7. A method as defined by claim 1, wherein the semiconductor substrate comprises a silicon substrate having a thermal oxide layer thereon.

8. A method as defined by claim 7, wherein the semiconductor substrate further comprises a silicon nitride layer on the thermal oxide layer.

9. A method as defined by claim 1, wherein the semiconductor substrate comprises a silicon substrate having a silicon nitride layer over the first and second active areas.

10. A method as defined by claim 8, wherein the semiconductor substrate further comprises a TEOS layer on the silicon nitride layer.

11. A method as defined by claim 1, wherein the semiconductor substrate comprises a silicon substrate having a TEOS layer over the first and second active areas.

12. A method as defined by claim 1, further comprising forming an oxide layer on an inside surface of the trench.

13. A method as defined by claim 12, wherein the oxide layer is formed prior to forming the first and second conductive type wells.

14. A method as defined by claim 1, further comprising planarizing the dielectric by chemical mechanical polishing.

15. A method as defined by claim 8, further comprising planarizing the dielectric by chemical mechanical polishing.

16. A method as defined by claim 10, further comprising planarizing the dielectric by chemical mechanical polishing.

17. A method as defined by claim 15, comprising sufficient chemical mechanical polishing to remove the silicon nitride layer.

18. A method as defined by claim 1, wherein filling the trench with the dielectric comprises depositing dielectric material on the semiconductor substrate.

19. A method as defined by claim 1, wherein forming an STI trench comprises:
    forming a photoresist pattern to define an area of the trench and exposing a surface of the TEOS layer, and
    etching the TEOS layer, the silicon nitride, the oxide layer, and the silicon substrate sequentially to form the STI trench.

20. A method as defined by claim 19, further comprising STI rounding by additional etching of the trench.

* * * * *